Oct. 11, 1960 J. J. ANDREA ET AL 2,956,215

RETAINING CLIP

Filed Feb. 11, 1957

INVENTOR.
JOHN J. ANDREA
EMIL L. MARTIN
BY
Moody & Habecker
ATTORNEYS

United States Patent Office 2,956,215

Patented Oct. 11, 1960

2,956,215

RETAINING CLIP

John J. Andrea, Marion, and Emil L. Martin, Cedar Rapids, Iowa, assignors to Collins Radio Company, Cedar Rapids, Iowa Filed Feb. 11, 1957, Ser. No. 639,327

1 Claim. (Cl. 317—234)

This invention relates to retaining clips and more particularly to retaining clips for mounting electronic components in a firm but convenient manner.

Prior methods of retaining electrical components such as transistors, capacitors and the like on printed circuit boards have involved clamps with screws and notches or rivets and unduly complicated layouts. The component to be mounted was all on one side of the mounting board, making the array much bulkier than desired. Further, the assembly and disassembly of the specific component was usually fairly difficult.

It is an object of this invention to provide a retaining clip for use in mounting electronic components in circuit boards such as the printed circuit boards now currently popular.

It is a further object to provide a mounting means for electronic components which is simple and easy to make and which is easy to use.

It is a feature of this invention that it is readily manufactured of flat sheet spring stock by a simple punching operation.

It is a further feature of this invention that preparation of the mounting board for this method of mounting components is simple and readily accomplished by a punching operation.

Further objects, features, and advantages of the invention will become apparent from the following description and claim when read in conjunction with the drawing in which:

Figure 1:
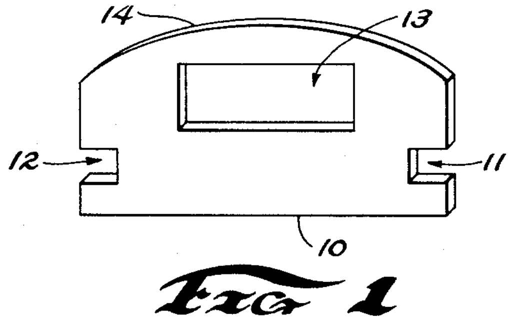
Figure 1 shows the clip used in the invention at rest.

Figure 1 shows the retaining clip used in the invention in its rest position. This clip is a relatively thin, flat and long piece of metal 10 composed of springy material such as a carbon steel or beryllium copper. Of course, plastics of sufficient durability and resistance to relaxation may be used in applications where an insulating clip is desired. In the sheet stock material 10 is punched, or formed in some manner, a pair of notches 11 and 12. These notches are at the ends of the length of the blank material 10. The notches have a width in the direction of the transverse dimension of the blank approximately the same as the thickness of the mounting board cooperative therewith.

Intermediate the two notches 11 and 12 is an aperture 13. This aperture is formed in blank 10 in the transverse direction, relative to the notches 11 and 12, in accord with the mounting flange of the device to be secured. Aperture 13 is positioned approximately midway in the length direction of the blank. For some applications the edge 14 may be rounded so as to reduce the amount of material protruding above the surface of the mounting board. The shape of edge 14 assumes such proportions as is necessary in the particular application.

Figure 2:
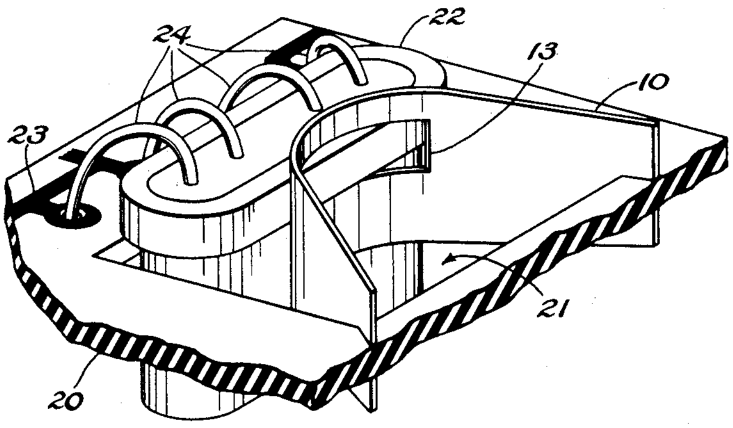
Figure 2 shows an isometric view of the invention with the clip of Figure 1 in use.

Figure 2 shows the clip of Figure 1 in use. A mounting board 20 composed of insulation such as is used in printed circuit work, has cut into it, by any of the well-known operations, an aperture or hole 21. This hole has a width related to the width of the component to be mounted. In Figure 2 a transistor 22 is shown, the width of the transistor controlling the width of the aperture 21. The length of the aperture 21 is determined by the thickness of the transistor or other component mounted and the necessary bow in the spring clip 10. This bow in clip 10 is needed to facilitate its insertion with sufficient compression remaining against the circuit component to retain clip and component within the hole 21.

It is obvious that the length of the clip 10 remaining between the bottoms of notches 11 and 12 is enough greater than the width of hole 21 to provide a large bow of the clip. The bight of the bow extends inwardly into the aperture 21 far enough to provide an elastic contact with the circuit component 22, yet not so far as to make insertion of the clip into the hole impossible. This last factor also controls the depth of the notches 11 and 12, which must be deep enough to retain the clip in the hole, yet shallow enough to permit insertion.

It is readily seen that aperture 13 of clip 10 has a width across the width of the clip just wide enough to encompass the flange or shoulder on the component mounted.

With mounting board 20 an insulating material, a printed circuit 23 such as is shown sketchily may be placed on the surface of the board 20 by any of the present-day techniques. Leads 24 from the circuit component 22 are brought down to make connections with the printed circuit or other components mounted on the mounting board 20.

The invention thus provides a means for mounting relatively bulky components on a mounting board in a manner which provides facile mounting and dismounting yet which provides the least bulk possible consistent with good practice.

Although this invention has been described with respect to particular embodiments thereof, it is not to be so limited because changes and modifications may be made therein which are within the full intended scope of the invention as defined by the appended claim.

We claim:

A mounting system for a transistor comprising in combination, a transistor containing a flange, a mounting board, and a leaf spring, said mounting board having a hole therethrough, said hole being adapted to receive said transistor and leaf spring, said leaf spring being mounted against said transistor under tension thereby substantially forming an arc, the ends of said leaf spring being spaced apart and containing slots for receiving the edge of said mounting board, and the center of said leaf spring bearing against said transistor and containing a slot adapted to receive said flange, whereby said transistor is rigidly retained within said mounting board.

References Cited in the file of this patent

UNITED STATES PATENTS

| | | |
|---|---|---|
| 1,779,681 | Smith et al. | Oct. 28, 1930 |
| 2,188,706 | Critchfield et al. | Jan. 30, 1940 |
| 2,216,886 | Langelier | Oct. 8, 1940 |
| 2,520,365 | Hopper | Aug. 29, 1950 |
| 2,597,168 | North | May 20, 1952 |
| 2,811,657 | Mollenberg | Oct. 29, 1957 |

FOREIGN PATENTS

| | | |
|---|---|---|
| 152,065 | Sweden | Oct. 25, 1955 |